United States Patent
Wu et al.

(10) Patent No.: US 12,324,173 B2
(45) Date of Patent: Jun. 3, 2025

(54) ULTRA-THIN SUPER JUNCTION IGBT DEVICE AND MANUFACTURING METHOD THEREOF

(71) Applicant: Shanghai Supersemiconductor Technology Co., Ltd., Shanghai (CN)

(72) Inventors: Yuzhou Wu, Shanghai (CN); Jiuying Yu, Shanghai (CN)

(73) Assignee: Shanghai Supersemiconductor Technology Co., Ltd., Shanghai (CN)

(*) Notice: Subject to any disclaimer, the term of this patent is extended or adjusted under 35 U.S.C. 154(b) by 453 days.

(21) Appl. No.: 17/683,300

(22) Filed: Feb. 28, 2022

(65) Prior Publication Data
US 2023/0155014 A1    May 18, 2023

(30) Foreign Application Priority Data
Nov. 12, 2021    (CN) .......................... 202111337346.7

(51) Int. Cl.
  *H01L 29/739*    (2006.01)
  *H01L 29/06*    (2006.01)
  *H01L 29/66*    (2006.01)
  *H10D 12/00*    (2025.01)
  *H10D 12/01*    (2025.01)
  *H10D 62/10*    (2025.01)

(52) U.S. Cl.
  CPC ......... *H10D 12/481* (2025.01); *H10D 12/038* (2025.01); *H10D 62/111* (2025.01)

(58) Field of Classification Search
  CPC ............. H01L 29/7397; H01L 29/0634; H01L 29/66348; H10D 12/481; H10D 12/038; H10D 62/111
  See application file for complete search history.

(56) References Cited

U.S. PATENT DOCUMENTS

2007/0181927 A1*  8/2007  Yedinak .............. H01L 29/7397
                                                257/E29.066
2008/0038850 A1  2/2008  Yamaguchi et al.
(Continued)

FOREIGN PATENT DOCUMENTS

CN    107195678 A    9/2017
CN    107275383 A    10/2017
(Continued)

OTHER PUBLICATIONS

Notification of first Office Action in 2021113373467, issued by CNIPA, dated Dec. 26, 2024.

*Primary Examiner* — Peniel M Gumedzoe
(74) *Attorney, Agent, or Firm* — Zhu Lehnhoff LLP

(57) ABSTRACT

The present invention discloses an ultra-thin super junction IGBT and a manufacturing method thereof, comprising: a metalized collector; a P-type collector region located on the metalized collector; an N-type FS layer located above the P-type collector region; an N-type FS isolating layer located above the N-type FS layer; a first N-type epitaxial layer located above the N-type FS isolating layer and a second N-type epitaxial layer located above the first N-type epitaxial layer; and a MOS structure located in the second N-type epitaxial layer. According to the present invention, thinning the chip thickness reduces forward conduction voltage drop and switching losses, while reducing thermal resistance and improving current conducting capability.

13 Claims, 19 Drawing Sheets

(56) References Cited

U.S. PATENT DOCUMENTS

2015/0287786 A1* 10/2015 Jeon .................. H01L 29/66348
　　　　　　　　　　　　　　　　　　　　　438/138
2018/0261666 A1* 9/2018 Zeng .................. H01L 29/0878

FOREIGN PATENT DOCUMENTS

| CN | 107342226 U | 11/2017 |
|---|---|---|
| CN | 109887990 A | 6/2019 |
| CN | 217280784 U | 8/2022 |
| KR | 20110127920 A | 11/2011 |

\* cited by examiner

ULTRA-THIN SUPER JUNCTION IGBT DEVICE AND MANUFACTURING METHOD THEREOF

The present application claims the priority of Chinese Patent Application No. 202111337346.7, filed on Nov. 12, 2021, the entire disclosure of which is hereby incorporated by reference.

TECHNICAL FIELD

The present invention relates to the technical field of power semiconductors, and more particularly to an ultra-thin super junction IGBT and a manufacturing method thereof.

BACKGROUND

Insulated Gate Bipolar Transistor (IGBT) devices are widely used in solar energy inverters, new energy vehicles, high voltage direct current transmission systems, high-speed railways, and other fields due to their advantages of high input resistance, high breakdown voltage, wide safe operating area, and easy driving, etc., which are similar as power MOS, and the advantages of low conduction voltage of bipolar devices, etc. It is the core device of today's power electronic systems of medium to high power. The current Infineon IGBT technology has been developed to the seventh generation. The technologies such as Micro Pattern Trench (MPT), Field Stop (FS), Carrier Storage (CS), Injection Enhanced (IE), and so on are adopted to obtain a good trade-off among conduction voltage drop, switching loss, and safe operating area. However, limited by the silicon limit, the thickness of the voltage blocking layer is about 60 μm when the 650V IGBT blocks voltage, as shown in FIG. 1, which makes it difficult to further thin the device to reduce conduction resistance, switching loss, and improve current conducting capability.

Being a device popularly studied by the academic community and industrial community in recent years, the super junction IGBT is a new power semiconductor device adding alternate PN columns to the epitaxial layer based on the traditional IGBT structure. The super junction structure formed by PN columns has a similar effect to super junction MOSs in the optimization of the device parameters such as blocking voltage and forward conduction voltage drop, etc. The introduction of PN columns greatly improves the voltage blocking capability of the super junction IGBT by making PN columns deplete each other to generate the transverse electric field in addition to the longitudinal electric field of the Pbody-N-Drift junction when the super junction IGBT is in off-state mode, thereby modulating the triangular electric field distribution of the traditional IGBT to an approximately rectangular distribution. On the premise of ensuring a certain breakdown voltage of the device, the concentration of N-Drift layer can be significantly increased so that the forward conduction voltage drop can be significantly reduced, and the conduction loss of the super junction IGBT can be facilitated to be significantly reduced in application. At the same current specification, the area of the super junction IGBT can be greatly reduced and the chip cost can be reduced. Currently, deep trench etching and backfilling process is one of the two manufacturing methods for fabricating super junction IGBTs. The process flow of deep trench etching and backfilling process is simple, but the requirement for etching equipment is high. Due to the limitation of etching equipment, in deep trench etching, the trench is not a perfect rectangular structure. With the deepening of reactive ion etching, the width of the trench will gradually decrease, forming a tapered structure that is wide at the top and narrow at the bottom. After filling P-type single crystal silicon, the narrow bottom of P column and N-Drift region are easy to form electric field concentration under blocking mode. So for 650V conventional SJ-IGBT, as shown in FIG. 2, the length of the overall P column is generally not less than 45 μm to ensure the voltage blocking capability of the device, and the total thickness is also generally not less than 60 μm with the addition of front MOS structure and backside collector structure. All these limit further reduction in conduction voltage and switching loss of IGBTs.

SUMMARY OF THE INVENTION

In view of the shortcomings existing in the prior art, an object of the present invention is to provide an ultra-thin super junction IGBT and the manufacturing method to thin the thickness of the chip, reduce the forward conduction voltage drop and switching loss of the device, and at the same time, reduce the thermal resistance of the device, and improve the current conducting capability. To achieve the above object and other advantages in accordance with the present invention, an ultra-thin super junction IGBT is provided, comprising:
  a metalized collector;
  a P-type collector region located on the metalized collector;
  an N-type FS layer located above the P-type collector region;
  an N-type FS isolating layer located above the N-type FS layer;
  a first N-type epitaxial layer located above the N-type FS isolating layer and a second N-type epitaxial layer located above the first N-type epitaxial layer; and a MOS structure located in the second N-type epitaxial layer.

Preferably, the P column is formed on two opposite sides of the first N-type epitaxial layer by a deep trench etching and backfilling process.

Preferably, the second N-type epitaxial layer comprises a trench formed by reactive ion etching, a thermally grown gate oxide layer arranged in the trench, heavily doped polysilicon deposited in the gate oxide layer, and a P-type body region formed by a self-alignment process, the P column disconnected from the P-type body region.

Preferably, mutually independent N-type emitter regions provided on both sides of the trench and in the P-type body region, a BPSG deposited above the second N-type epitaxial layer, and a metalized emitter located above the BPSG are further included.

Preferably, a substrate is further included. The substrate has a random doping concentration of N type or a random doping concentration of P type, and the IGBT can also be applied to P-type super junction IGBT, and a semiconductor material of silicon carbide or gallium nitride.

Preferably, no substrate is included. The first N-type epitaxial layer is made of float-zone monocrystalline silicon.

Preferably, the N-type FS isolating layer on the backside of the IGBT can be implanted or not, wherein ions when implanted are phosphorus, arsenic, hydrogen, or helium.

Preferably, the second N-type epitaxial layer is formed by epitaxy or by steps as follows: the P column is formed by deep trench etching and backfilling process on the first N-type epitaxial layer structure, and then the top P column portion in the first N-type epitaxial layer is compensated for N-type by N-type high energy implantation.

Preferably, the backside of the IGBT is ground to the bottom of the P column and then ground by several microns, followed by implantation of the N-type FS layer and the P-type collector region.

A manufacturing method for an ultra-thin super junction IGBT comprises the following steps:

S1, forming the first N-type epitaxial layer on any substrate, using a reactive ion etching process to form a deep trench on the first N-type epitaxial layer, and using a backfilling P-type single crystal silicon to form the P column;

S2, forming a second N-type epitaxial layer above the first N-type epitaxial layer, and forming a trench on the second N-type epitaxial layer by reactive ion etching, then forming a gate oxide layer which is thermally grown by means of dry oxidation in the trench, and forming a polysilicon gate electrode by depositing heavily doped polysilicon in the gate oxide layer and etching back;

S3, forming a P-type body region by using ion implantation through the self-alignment process and high-temperature drive-in, and providing an N-type emitter region, formed by photolithograph and implantation, in the P-type body region;

S4, a BPSG deposited above the second N-type epitaxial layer being subjected to high-temperature reflow, performing contact photolithography above the BPSG, etching silicon with a thickness of 3000-5000 A, and depositing an upper surface metal to form a metalized emitter;

S5, turning over the substrate and thinning, performing grinding for several micrometers after grinding to the bottom of the P column, and performing the first implantation of the N-type FS layer;

S6, continuing the second N-type FS isolating layer implantation and impurity activation;

S7, implanting and annealing the P-type collector region on backside of the P-type collector region;

and S8, forming a metalized collector by depositing a metal layer on backside of the P-type collector region.

The beneficial effects of the present invention compared to the prior art are as follows: a super junction structure is formed by epitaxially growing a first N-type epitaxial layer on a substrate silicon wafer through a deep trench etching and backfilling process, and a surface MOS structure is formed by a second epitaxy, and a floating P column is formed. The backside is thinned, the device is ground to the bottom of the P column, and thinning by several microns is performed to remove part of the narrow bottom of the P column so that the electrical field concentration is alleviated when operating in blocking mode. Implanting N-type impurities at backside to form an FS layer, implanting P-type impurities at the back to form a collector region, and implanting hydrogen ions again to form an FS isolating layer to compensate for the P column to N-type. Metal is sputtered at backside, thus completing device manufacture. The floating P column ensures that the device operates in a conductivity modulating mode, and reduces the forward conduction voltage drop of the device. The N-type FS isolating layer formed by hydrogen ion implantation can reduce switching losses when turning off the device. Thinning the device to remove part of the bottom region of the P column can reduce the electric field concentration when the device blocks voltage, thereby ensuring a sufficient breakdown voltage of the device and also reducing the thickness of the N-Drift region, which can reduce the forward conduction voltage drop of the device and reduce the switching loss. The thinned chip thickness reduces the thermal resistance of the device and increases the current capability of the device. The present invention provides a 650V ultra-thin super junction IGBT with a thickness which can be thinned to 45 µm, the breakdown voltage is greater than 700V, the forward conduction voltage drop is reduced by at least 0.1V compared with a conventional super junction IGBT of the same type, the switching loss and thermal resistance are both reduced by more than 10%, and the current capability of the super junction IGBT is significantly improved.

BRIEF DESCRIPTION OF THE DRAWINGS

FIG. 5-1-15 are structural views showing the manufacturing steps of an ultra-thin super junction IGBT and the manufacturing method according to the present invention.

DETAILED DESCRIPTION OF THE PREFERRED EMBODIMENTS

Figure 1:
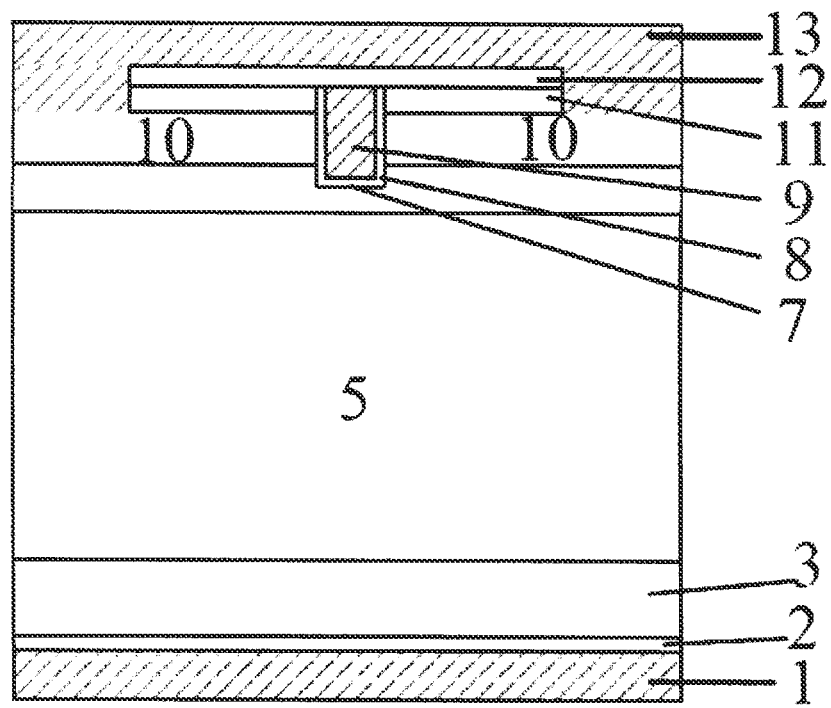
FIG. 1 is a schematic view of the structure of a conventional Trench FS-IGBT.
Figure 2:
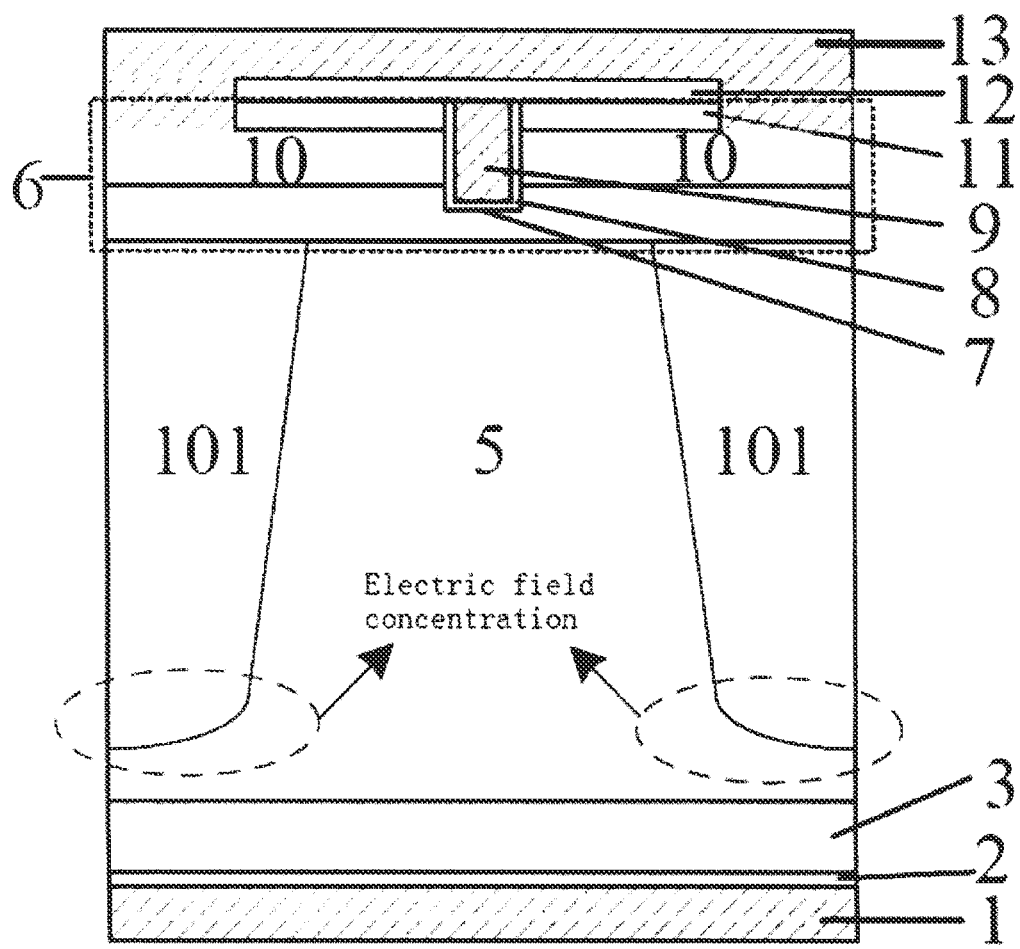
FIG. 2 is a schematic view of the structure of a conventional super junction IGBT.
Figure 3:
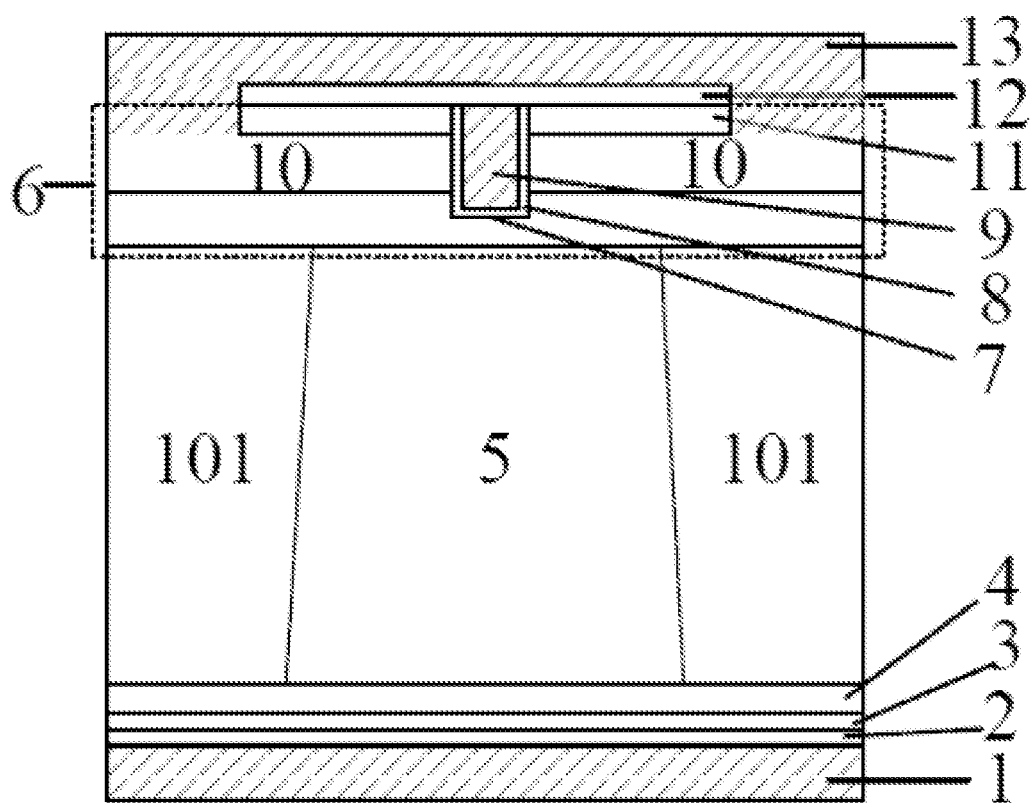
FIG. 3 is a schematic view showing the structure of an ultra-thin super junction IGBT and the manufacturing method according to the present invention.
Figure 4:
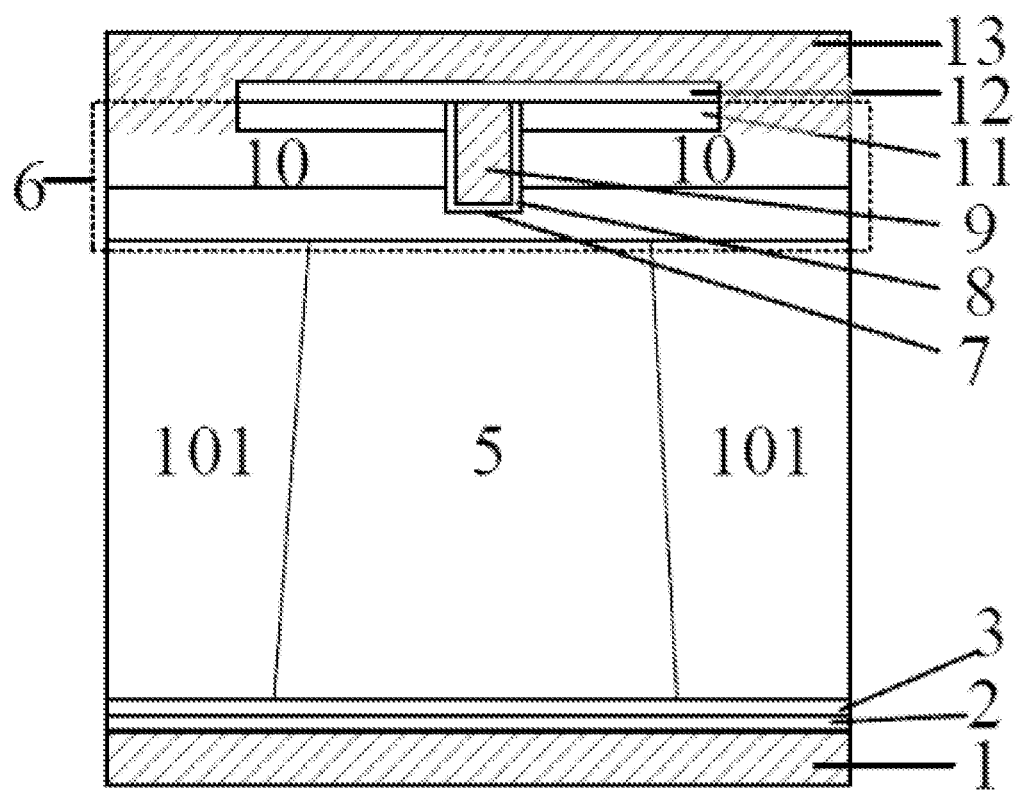
FIG. 4 is a schematic view showing the structure of an embodiment of an ultra-thin super junction IGBT and the manufacturing method according to the present invention.

The technical solutions in the embodiments of the present invention will be clearly and completely described below in conjunction with the accompanying drawings in the embodiments of the present invention. Obviously, the described embodiments are only a part of the embodiments of the present invention, rather than all the embodiments. Based on the embodiments of the present invention, all other embodiments obtained by a person of ordinary skills in the art without involving any inventive effort are within the scope of the present invention.

Referring to FIGS. 1-5, an ultra-thin super junction IGBT includes: a metalized collector 1;
a P-type collector region 2 located on the metalized collector 1;
an N-type FS layer 3 located above the P-type collector region 2;
an N-type FS isolating layer 4 located above the N-type FS layer 3;
a first N-type epitaxial layer 5 located above the N-type FS isolating layer 4 and a second N-type epitaxial layer 6 located above the first N-type epitaxial layer 5, and a MOS structure located in the second N-type epitaxial layer, wherein when turning off the device, the N-type FS isolating layer formed by hydrogen ion implantation can help to reduce the switching loss.

Further, two opposite sides of the first N-type epitaxial layer 5 form a P column 101 through a deep trench etching and backfilling process. The floating P column ensures that the device operates in a conductivity modulating mode, and reduces the forward conduction voltage drop of the device.

Further, the second N-type epitaxial layer 6 comprises a trench 7 formed by reactive ion etching, a thermally grown gate oxide layer 8 arranged in the trench 7, heavily doped polysilicon 9 deposited in the gate oxide layer 8, and a P-type body region 10 formed by a self-alignment process, the P column 101 disconnected from the P-type body region 10.

Further, mutually independent N-type emitter regions 11 provided on both sides of the trench 7 and in the P-type body region 10, a BPSG 12 deposited above the second N-type epitaxial layer 6, and a metalized emitter 13 located above the BPSG 12 are further included.

Further, a substrate is further included. The substrate has a random doping concentration of N type or a random doping concentration of P type, and the IGBT can also be applied to P type super junction IGBT, and a semiconductor material of silicon carbide, or gallium nitride.

Further, no substrate is included. The first N-type epitaxial layer 5 is made of a float-zone monocrystalline silicon.

Further, the N-type FS isolating layer 4 on the backside of the IGBT can be implanted or not implanted, the ions when implanted are phosphorus, arsenic, hydrogen, or helium, and the backside of the IGBT is the side provided with the N-type FS isolating layer 4.

Further, the second N-type epitaxial layer 6 is formed by epitaxy or by steps as follows: the P column 101 is formed by deep trench etching and backfilling process on the first N-type epitaxial layer 5 structure, and then the top P column portion in the first N-type epitaxial layer 5 is compensated for N-type by N-type high energy implantation.

Further, the backside of the IGBT is ground to the bottom of the P column 101 and then ground for several micrometers, and then the N-type FS layer 3 and the P-type collector region 2 are implanted; after the backside of the IGBT is thinned, only one implantation of the N-type FS layer is needed to achieve the isolation between the P-type collector region 2 and the P column 101; further, thinning to remove part of the bottom region of the P column can reduce the electric field concentration when the device blocks voltage, thereby ensuring a sufficient breakdown voltage of the device and also reducing the thickness of the N-Drift region, which can reduce the forward conduction voltage drop of the device and reduce the switching loss. The thinned chip thickness reduces the thermal resistance of the device and increases the current capability of the device.

Figures 1, 5:
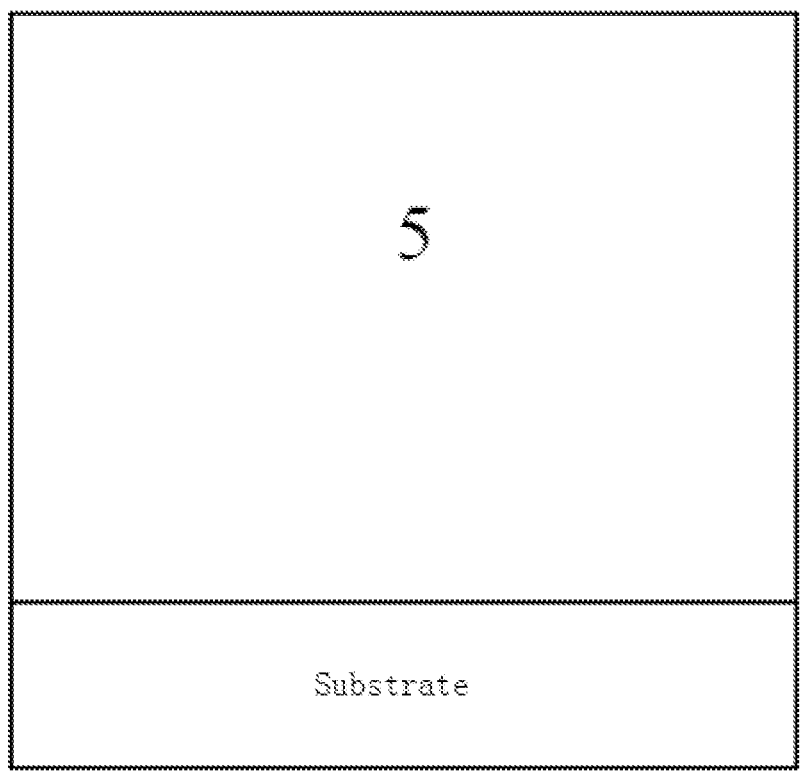
Figures 2, 5:
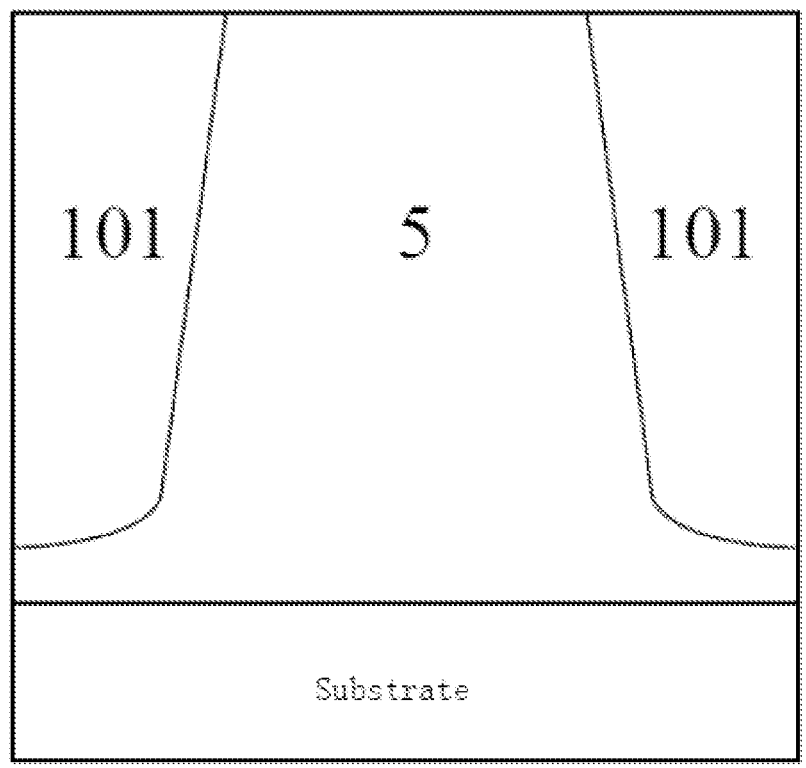
Figures 3, 5:
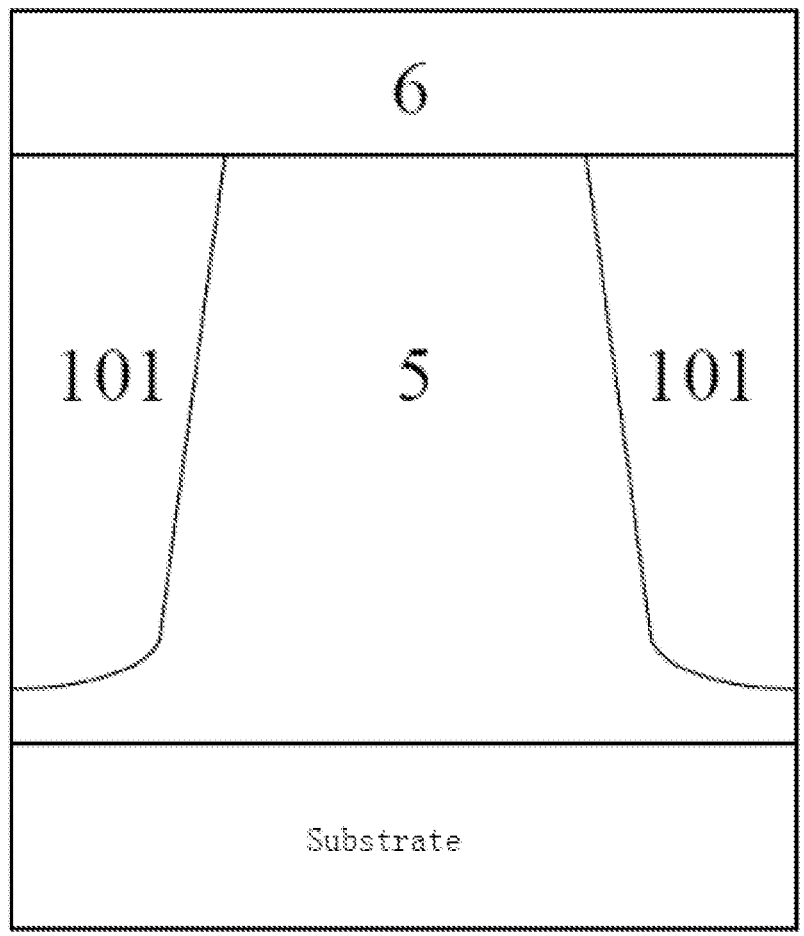
Figures 4, 5:
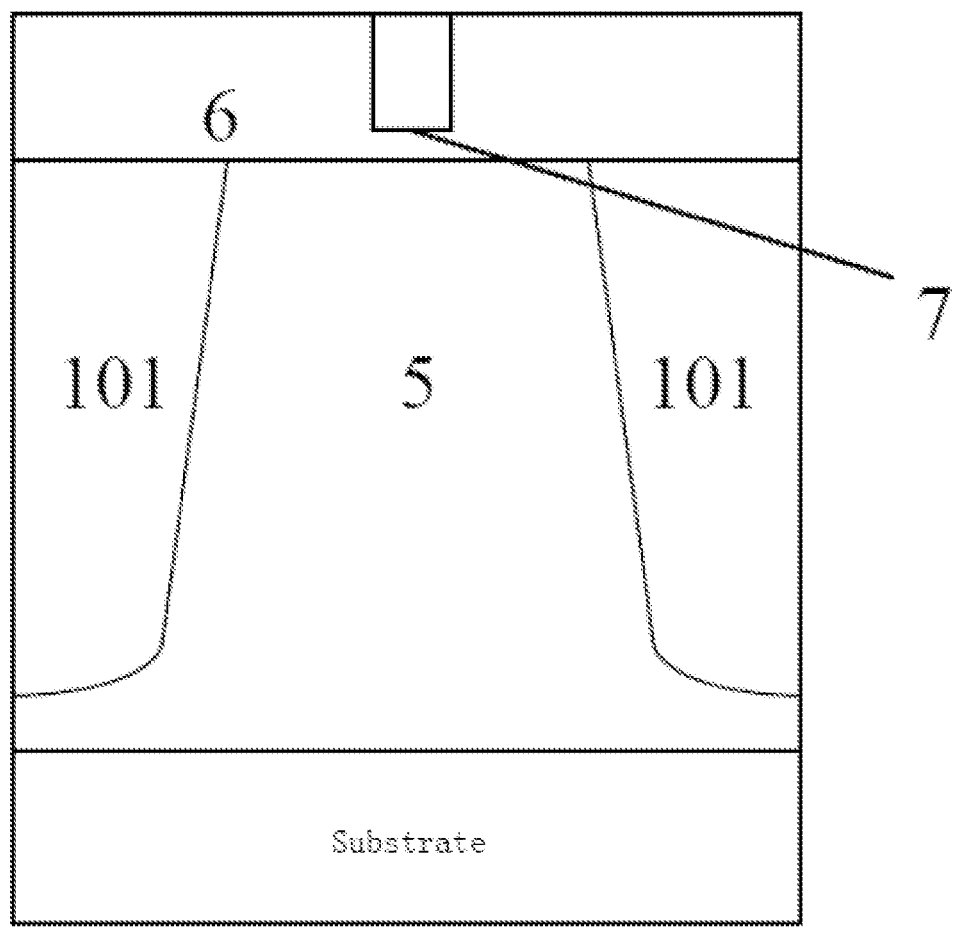
Figure 5:
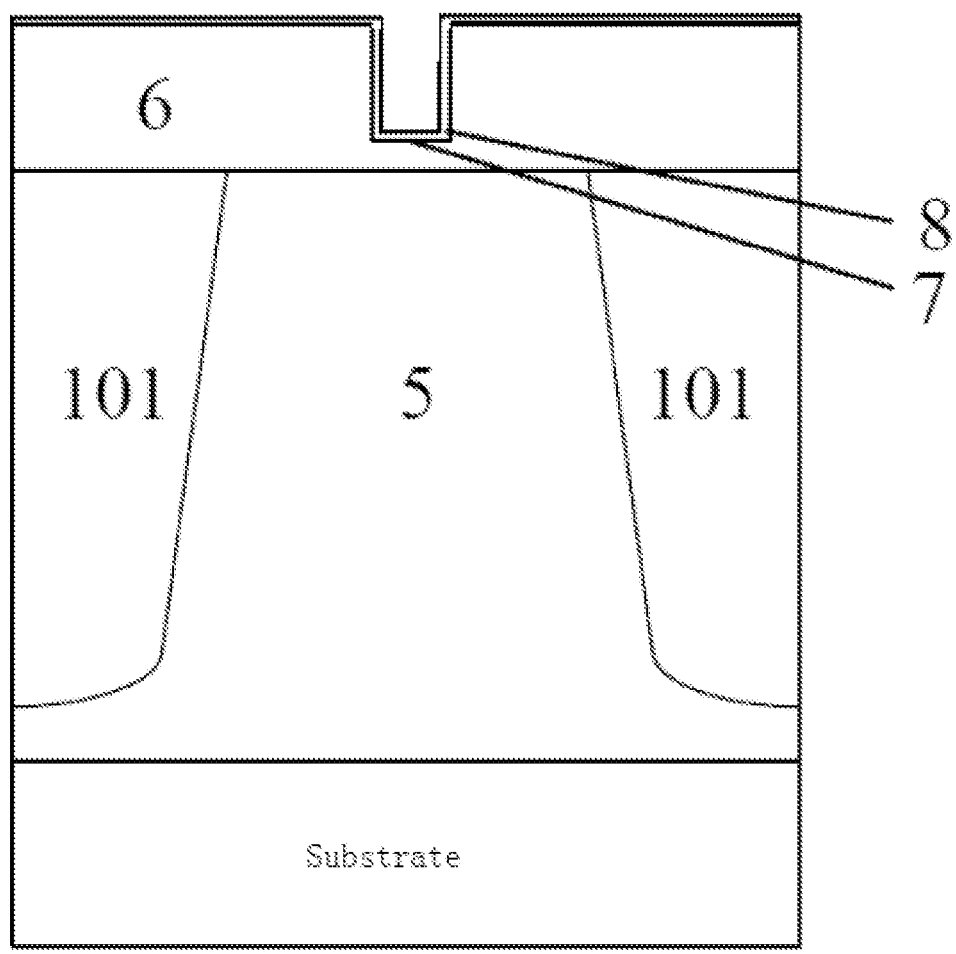
Figures 5, 6:
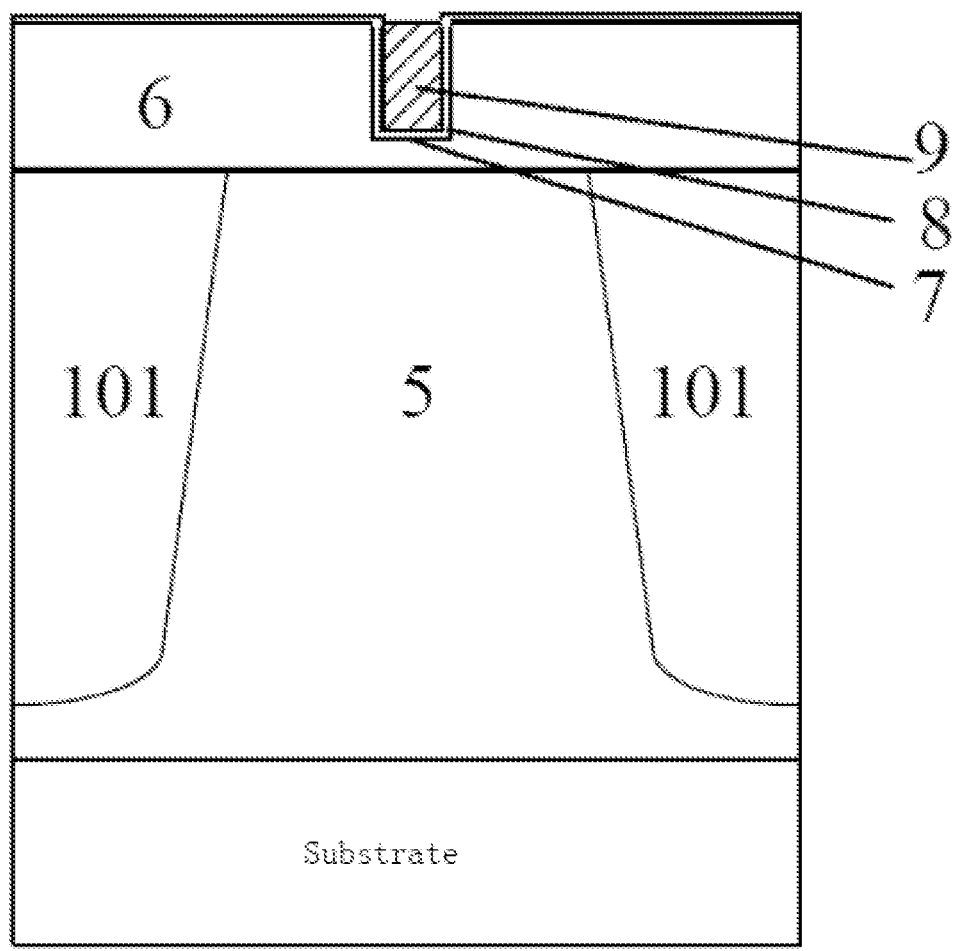
Figures 5, 6, 7:
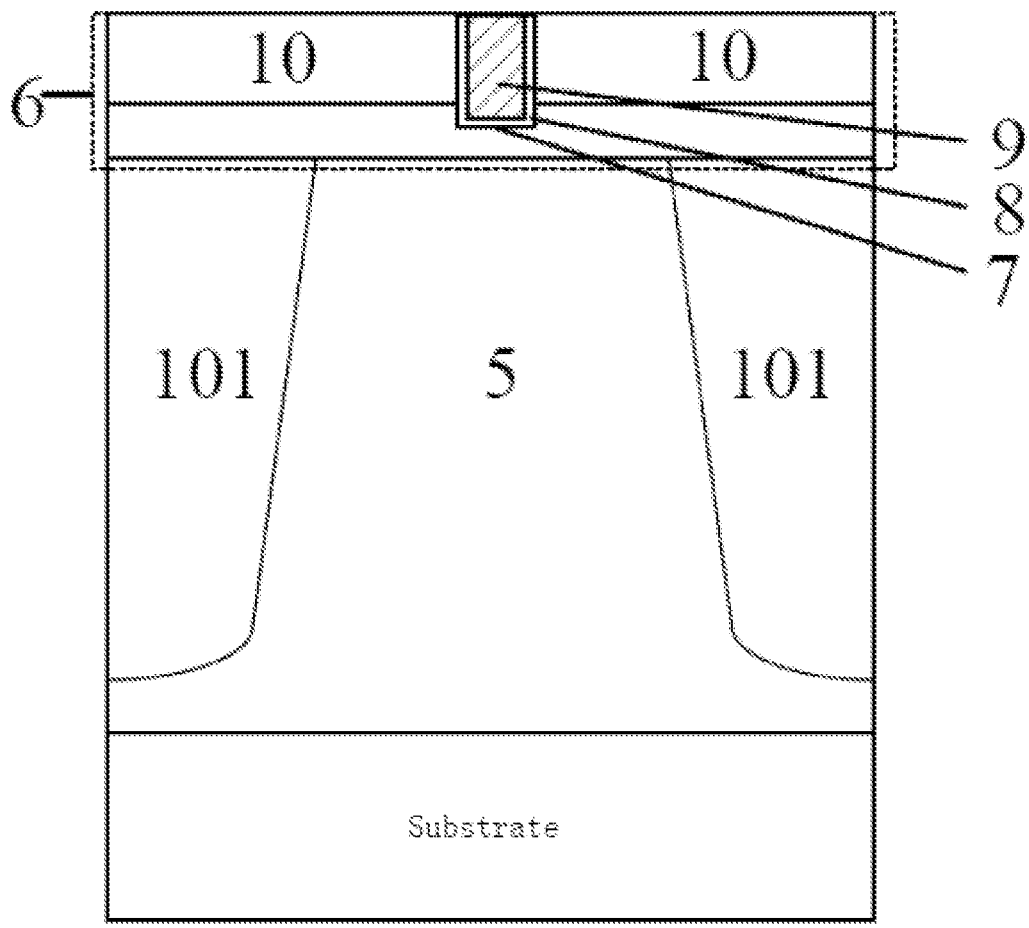
Figures 5, 6, 7, 8:
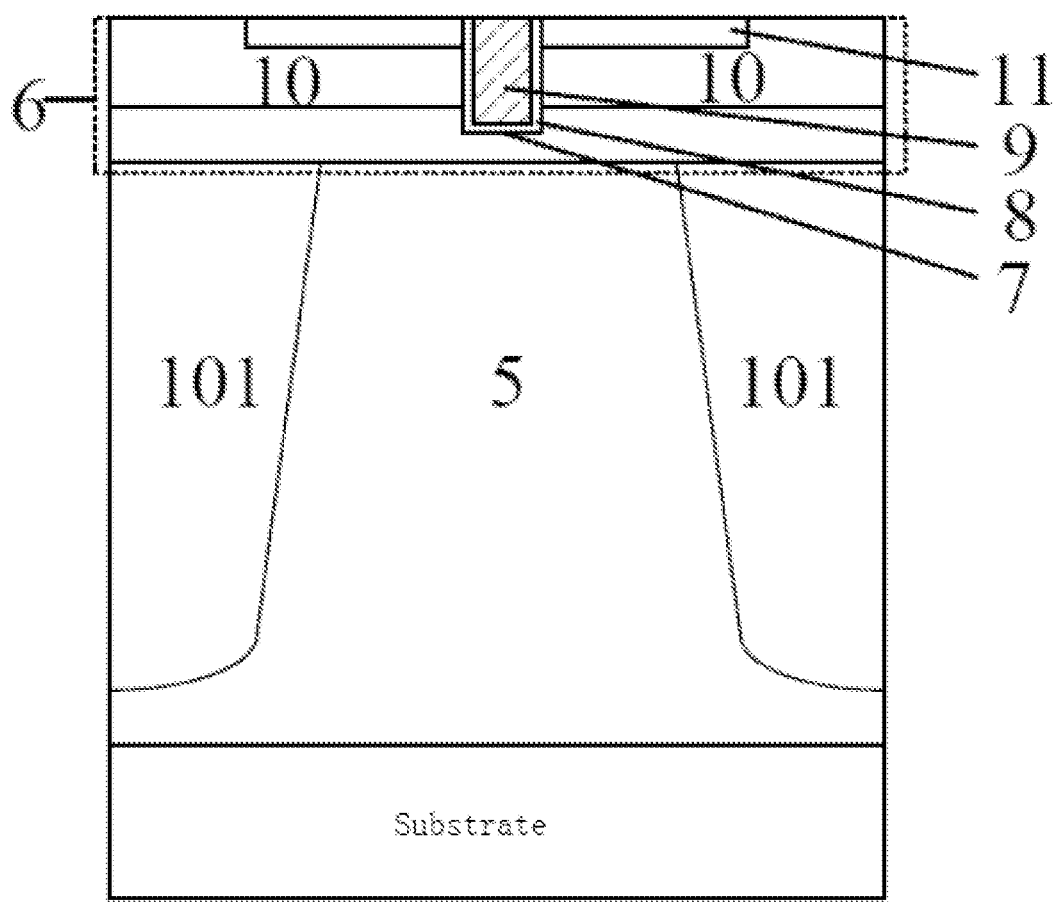
Figures 5, 6, 7, 8, 9:
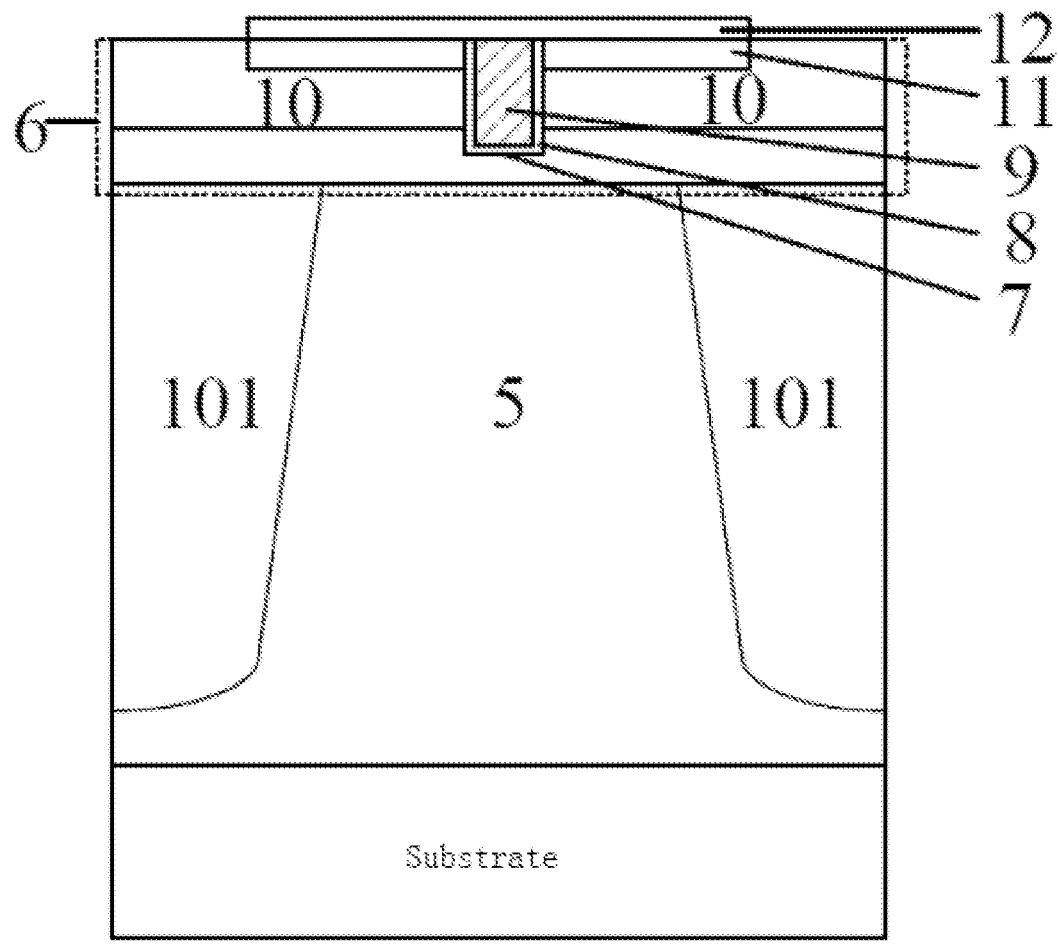
Figures 5, 6, 7, 8, 9, 10:
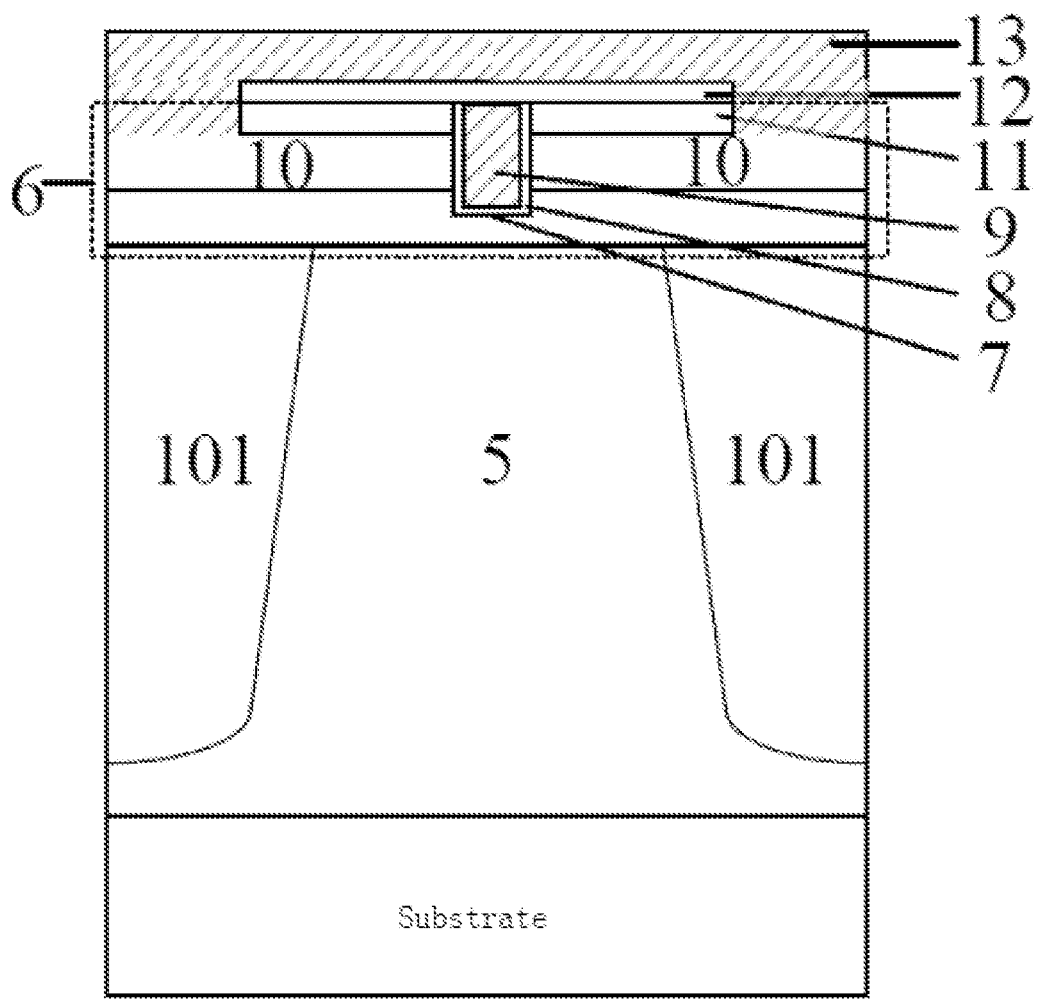
Figures 5, 6, 7, 8, 9, 10, 11:
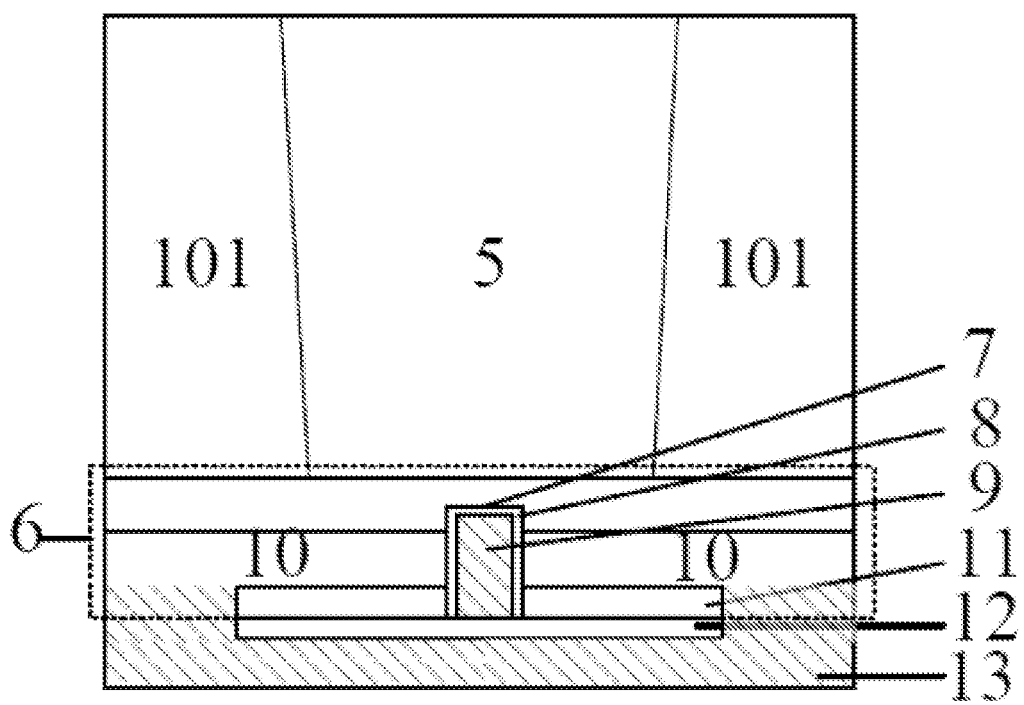
Figures 5, 6, 7, 8, 9, 10, 11, 12:
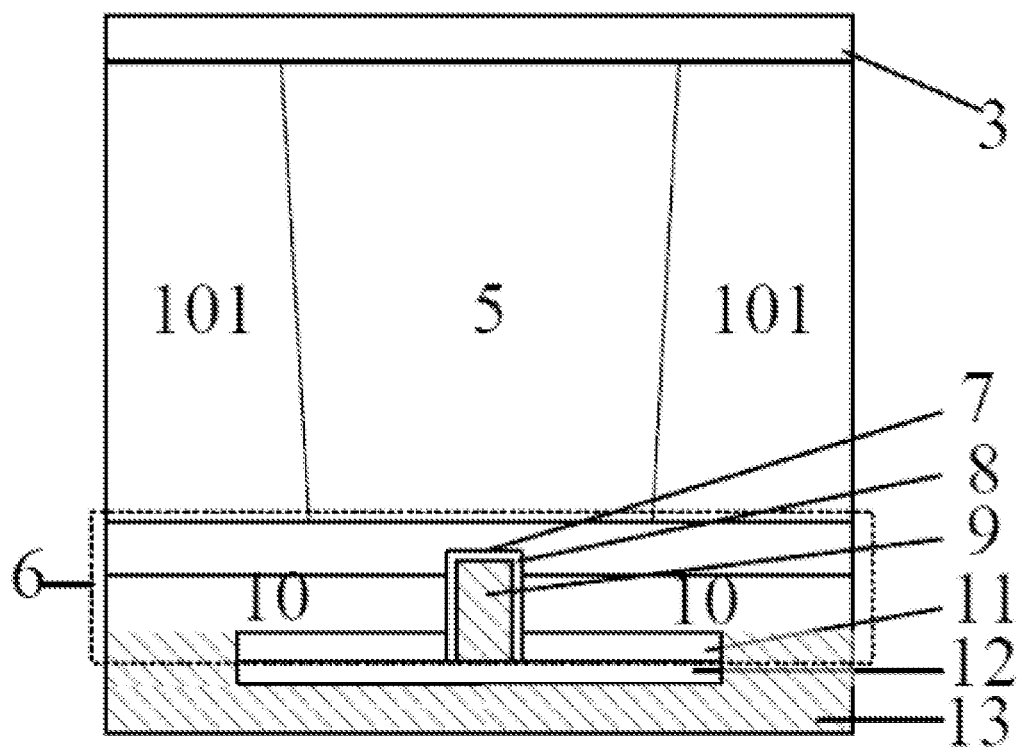
Figures 5, 6, 7, 8, 9, 10, 11, 12, 13:
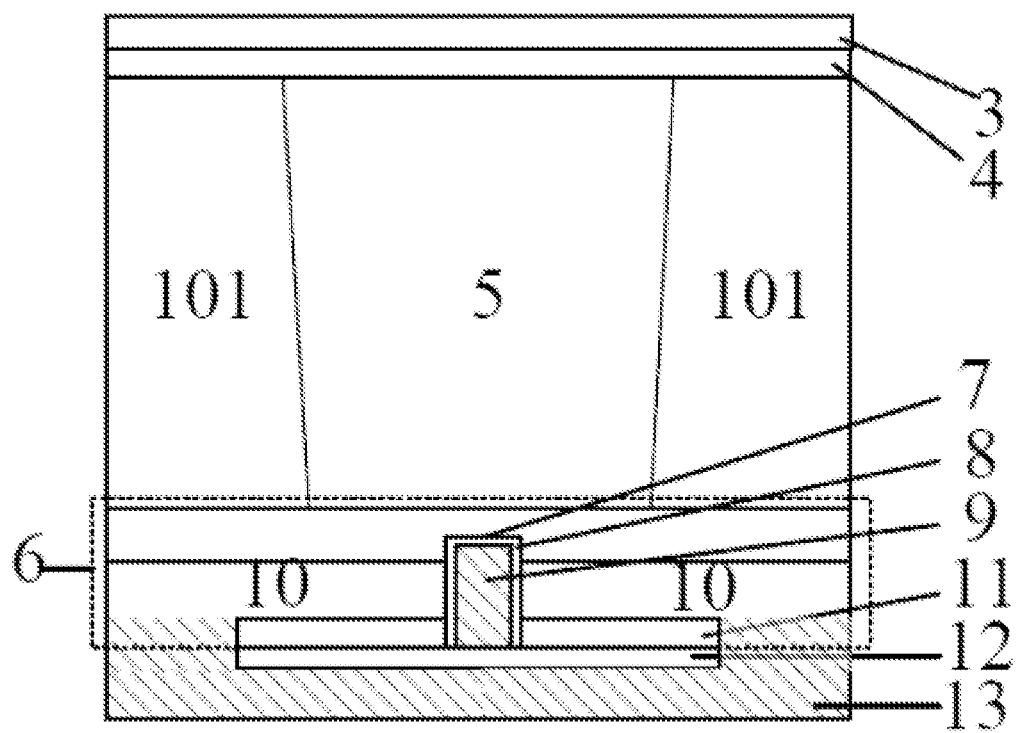
Figures 5, 6, 7, 8, 9, 10, 11, 12, 13, 14:
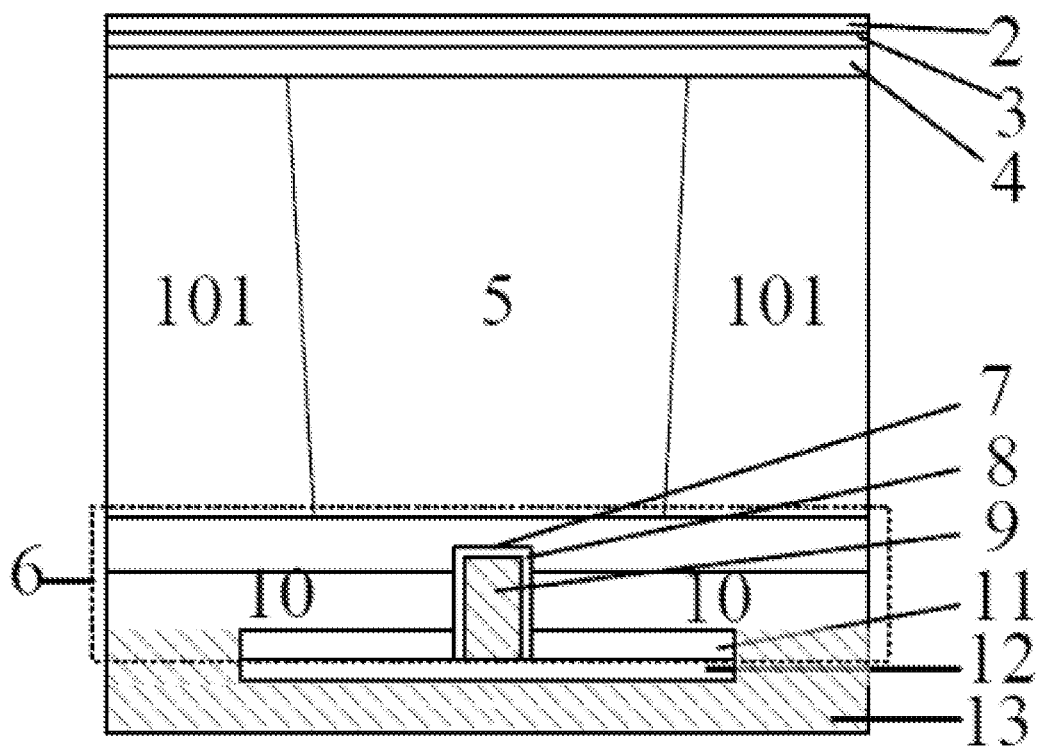
Figures 5, 6, 7, 8, 9, 10, 11, 12, 13, 14, 15:
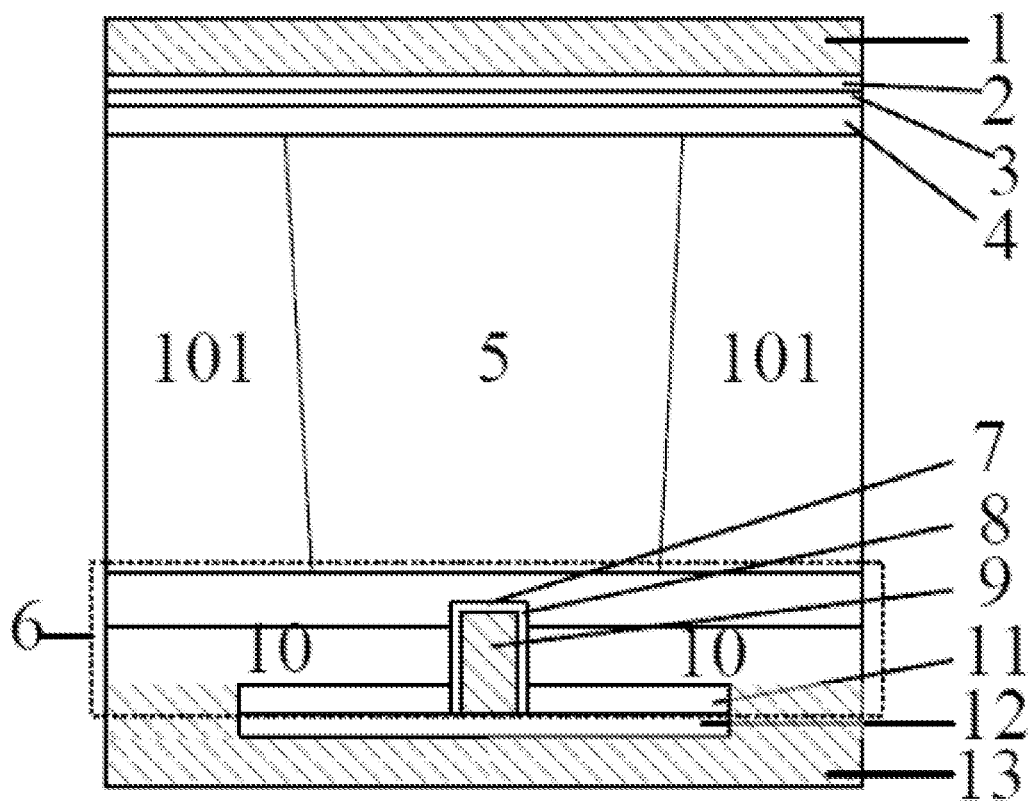

With reference to FIGS. 5-1-15, a manufacturing method for an ultra-thin super junction IGBT comprises the following steps:

S1, forming a first N-type epitaxial layer 5 on any substrate, using a reactive ion etching process to form a deep trench on the first N-type epitaxial layer 5, and using a backfilling P-type single crystal silicon to form a P column 101;

S2, forming a second N-type epitaxial layer 6 above the first N-type epitaxial layer 5, and forming a trench 7 on the second N-type epitaxial layer 6 by reactive ion etching, then forming a gate oxide layer 8 which is thermally grown by means of dry oxidation in the trench 7, and forming a polysilicon gate electrode 9 by depositing heavily doped polysilicon in the gate oxide layer 8 and etching back;

S3, forming a P-type body region 10 by using ion implantation through the self-alignment process and high-temperature drive-in, and providing an N-type emitter region 11, formed by photolithographic implantation, in the P-type body region 10;

S4, a BPSG 12 deposited above the second N-type epitaxial layer 6 being subjected to high-temperature reflow, performing contact photolithography above the BPSG 12, etching silicon with a thickness of 3000-5000 A, and depositing an top metal to form a metalized emitter 13;

S5, turning over the substrate and thinning, performing grinding for several micrometers after grinding to the bottom of the P column 101, and performing the first implantation of the N-type FS layer 3;

S6, continuing the second N-type FS isolating layer 4 implantation and impurity activation;

S7, implanting and annealing the P-type collector region 2 on backside of the P-type collector region 2;

and S8, forming a metalized collector 1 by depositing a metal layer on backside of the P-type collector region 2.

The number of equipment and process scales described herein is intended to simplify the description of the present invention, and applications, modifications, and variations of the present invention will be apparent to those skilled in the art.

While the implementation mode of the present invention has been disclosed above, it is not intended to be limited to the applications set forth in the description and the implementation mode, but it is fully capable of being applied to various fields suitable for the present invention. Additional modifications will readily occur to those skilled in the art, and the present invention is not limited to the specific details and illustrative examples shown and described herein without departing from the general concept as defined by the appended claims and their equivalents.

The invention claimed is:

1. An ultra-thin super junction insulated gate bipolar transistor (IGBT) comprising:
   a first N-type epitaxial layer;
   a first P column formed in the first N-type epitaxial layer and extending over an entire height of the first N-type epitaxial layer,
   the first P column being formed by forming a first trench in the first N-type epitaxial layer while leaving a portion of the first N-type epitaxial layer remaining below a lower end of the first trench, backfilling the first trench with P-type silicon, and then grinding across an entire width of a lower end of the first N-type epitaxial layer to remove all portions of the first N-type epitaxial layer below the lower end of the first trench and a portion of the lower end of the first trench to form a continuous bottom surface of the first P column and the first N-type epitaxial layer extending across an entire width of the first P column and the first N-type epitaxial layer;
   a second N-type epitaxial layer formed above the first N-type epitaxial layer,
   a P-type body region which is formed in the second N-type epitaxial layer and is not directly connected to the first P column;
   two N-type emitter regions formed in the P-type body region;
   an N-type field stop layer formed below the first P column and the first N-type epitaxial layer;
   a P-type collector region located below the N-type field stop layer; and
   a metallized collector located below the P-type collector region.

2. The ultra-thin super junction IGBT as claimed in claim 1 further comprising an N-type field stop isolation layer formed between the N-type field stop layer and the bottom surface of the P column and the first N-type epitaxial layer.

3. The ultra-thin super junction IGBT as claimed in claim 1 further comprising:
  a second trench extending into the P-type body region and the second N-type epitaxial layer;
  a gate oxide lining the second trench; and
  polysilicon disposed within the second trench inside the gate oxide.

4. The ultra-thin super junction IGBT as claimed in claim 1 further comprising:
  borophosphosilicate glass deposited above the P-type body region; and
  a metallized emitter located above the borophosphosilicate glass.

5. The ultra-thin super junction IGBT as claimed in claim 1 further comprising a second P column which is disposed on an opposite widthwise side of the first N-type epitaxial layer from the first P-column and is not directly connected to the P-type body region.

6. The ultra-thin super junction IGBT as claimed in claim 2 wherein the N-type field stop isolation layer is formed by implanting ions selected from phosphorus, arsenic, hydrogen or helium into the N-type field stop layer.

7. The ultra-thin super junction IGBT as claimed in claim 1 wherein the second N-type epitaxial layer is formed by epitaxy.

8. The ultra-thin super junction IGBT as claimed in claim 1 wherein the second N-type epitaxial layer is formed by N-type high energy implantation of the upper end of the first P column.

9. An ultra-thin super junction insulated gate bipolar transistor (IGBT) comprising:
  a first N-type epitaxial layer;
  two P columns formed in the first N-type epitaxial layer on opposite widthwise sides of the first N-type epitaxial layer, each P column extending over an entire height of the first N-type epitaxial layer, a lower end of the first N-type epitaxial layer and a lower end of each P column lying along a single surface extending across an entire width of the IGBT with no portion of the first N-type epitaxial layer extending below the lower ends of the P columns,
  a second N-type epitaxial layer formed above the first N-type epitaxial layer and directly contacting upper ends of the P columns and an upper end of the first N-type epitaxial layer;
  a P-type body region which is formed in the second N-type epitaxial layer and is not directly connected to the P columns;
  two N-type emitter regions formed in the P-type body region;
  an N-type field stop layer formed below the P columns and the first N-type epitaxial layer;
  a P-type collector region located below the N-type field stop layer; and
  a metallized collector located below the P-type collector region.

10. The ultra-thin super junction IGBT as claimed in claim 9 further comprising an N-type field stop isolation layer formed between the N-type field stop layer and the lower ends of the P columns and the first N-type epitaxial layer.

11. The ultra-thin super junction IGBT as claimed in claim 9 further comprising:
  a trench extending into the P-type body region and the second N-type epitaxial layer;
  a gate oxide lining the trench; and
  polysilicon disposed inside the trench inside the gate oxide.

12. The ultra-thin super junction IGBT as claimed in claim 9 further comprising:
  borophosphosilicate glass deposited above the P-type body region; and
  a metallized emitter located above the borophosphosilicate glass.

13. The ultra-thin super junction IGBT as claimed in claim 10 wherein the N-type field stop isolation layer is implanted with ions selected from phosphorus, arsenic, hydrogen, and helium.

* * * * *